(12) United States Patent
Chen

(10) Patent No.: US 12,117,244 B2
(45) Date of Patent: Oct. 15, 2024

(54) VAPOR CHAMBER AND MANUFACTURING METHOD OF THE SAME

(71) Applicant: COOLER MASTER CO., LTD., Taipei (TW)

(72) Inventor: Chi-Lung Chen, New Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 0 days.

(21) Appl. No.: 18/173,576

(22) Filed: Feb. 23, 2023

(65) Prior Publication Data

US 2023/0204300 A1 Jun. 29, 2023

Related U.S. Application Data

(62) Division of application No. 16/870,297, filed on May 8, 2020, now Pat. No. 11,635,263.

(60) Provisional application No. 62/846,268, filed on May 10, 2019.

(51) Int. Cl.
*F28D 15/04* (2006.01)
*F28D 15/02* (2006.01)
*H01L 23/427* (2006.01)
*H05K 7/20* (2006.01)

(52) U.S. Cl.
CPC ......... *F28D 15/04* (2013.01); *F28D 15/0233* (2013.01); *F28D 15/0283* (2013.01); *F28D 15/046* (2013.01); *H01L 23/427* (2013.01); *H05K 7/20309* (2013.01); *H05K 7/20318* (2013.01); *H05K 7/20336* (2013.01)

(58) Field of Classification Search
CPC .. F28D 15/04; F28D 15/0233; F28D 15/0283; F28D 15/046; H01L 23/427; H05K 7/20309; H05K 7/20318; H05K 7/20336
USPC ..................................................... 165/104.26
See application file for complete search history.

(56) References Cited

U.S. PATENT DOCUMENTS

| | | | |
|---|---|---|---|
| 6,889,756 B1 * | 5/2005 | Hou ....................... | H01L 23/427 174/15.2 |
| 10,317,067 B2 | 6/2019 | Watanabe | |
| 11,359,869 B2 * | 6/2022 | Wakaoka ............... | H01L 23/427 |
| 11,788,797 B2 * | 10/2023 | Haj-Hariri ............... | B64G 1/50 165/185 |
| 11,930,620 B2 * | 3/2024 | Ku .......................... | G06F 1/203 |
| 2003/0136551 A1 | 7/2003 | Bakke | |
| 2006/0005950 A1 * | 1/2006 | Wang ................... | F28D 15/0233 257/E23.088 |
| 2009/0040726 A1 | 2/2009 | Hoffman et al. | |
| 2013/0025829 A1 * | 1/2013 | Huang ................ | F28D 15/0233 165/104.26 |

(Continued)

*Primary Examiner* — Joel M Attey
(74) *Attorney, Agent, or Firm* — Merchant & Gould P.C.

(57) ABSTRACT

A heat dissipating device includes a first casing includes a recessed portion, and a second casing coupled to the first casing. The recessed portion at least partially defines an evaporator section of the heat dissipating device, a condenser section of the heat dissipating device is disposed surrounding the recessed portion, and the first casing and the second casing enclose an internal space of the heat dissipating device. The heat dissipating device further includes a plurality of first support structures arranged in the recessed portion, a plurality of second support structures arranged in the condenser section, and a plurality of heat transfer structures arranged in the recessed portion.

20 Claims, 10 Drawing Sheets

(56) References Cited

U.S. PATENT DOCUMENTS

| | | |
|---|---|---|
| 2013/0048251 A1 | 2/2013 | Xiao et al. |
| 2015/0041103 A1 | 2/2015 | Kiley et al. |
| 2016/0003555 A1 | 1/2016 | Sun et al. |
| 2017/0082378 A1 | 3/2017 | Wang et al. |
| 2017/0303441 A1 | 10/2017 | Farshchian et al. |
| 2017/0350657 A1 | 12/2017 | Yeh et al. |
| 2018/0320997 A1 | 11/2018 | He et al. |
| 2019/0027424 A1 | 1/2019 | Mira et al. |
| 2020/0049418 A1 | 2/2020 | Chu et al. |

\* cited by examiner

VAPOR CHAMBER AND MANUFACTURING METHOD OF THE SAME

CROSS-REFERENCE TO RELATED APPLICATIONS

This non-provisional application is a divisional application of non-provisional application Ser. No. 16/870,297 filed May 8, 2020, which claims priority under 35 U.S.C. § 120 to U.S. provisional application No. 62/846,268 filed May 10, 2019, the entire contents of both these applications are hereby incorporated by reference.

BACKGROUND

During operation of electronic devices, the heat generated by the processors must be dissipated quickly and efficiently to keep operating temperatures within manufacturer recommended ranges. As these electronic devices increase in functionality and applicability so does operating speed of the processors used therein. With each new generation of electronic devices being thinner and more compact, thermal management of these devices becomes challenging as spacing between the different heat sources in the electronic devices is reduced.

Vapor chambers are used to dissipate heat. In general, vapor chambers are formed by flattening heat pipes to around 30% to 60% of their original diameter or bonding an upper and lower casing together. Vapor chambers are vacuum containers that carry heat from a heat source by evaporation of a working fluid which is spread by a vapor flow filling the vacuum, thereby increasing the thermally connected surface area. The vapor flow eventually condenses over cooler surfaces, and, as a result, the heat is uniformly distributed from an evaporation surface (heat source interface) to a condensation surface (larger cooling surface area). Thereafter, condensed fluid flows back to near the evaporation surface. A wick structure is often used to facilitate the flow of the condensed fluid by capillary force back to the evaporation surface, keeping the evaporation surface wet for large heat fluxes.

The thermal performance of vapor chambers is dependent on the effectiveness of the vapor chambers to dissipate heat via the phase change (liquid-vapor-liquid) mechanism. The capillary force generated in the wick structure must overcome the liquid pressure drop in the wick and vapor pressure drop in the vapor chamber. The capillary force generated is lower when the vapor chambers are thin, as the liquid pressure drop and vapor pressure drop are higher when spacing is reduced. Additionally, in such an example, to minimize thermal resistance, small feature sizes for structures are typically designed near the evaporation surface. The low porosity and permeability of the small feature sized evaporation surface structures, compounded with sintered powdered wicks having high capillary force and having high liquid pressure drop, often increase fluid resistance to sustain capillary force driven flow throughout the wick structures.

Figure 1A:
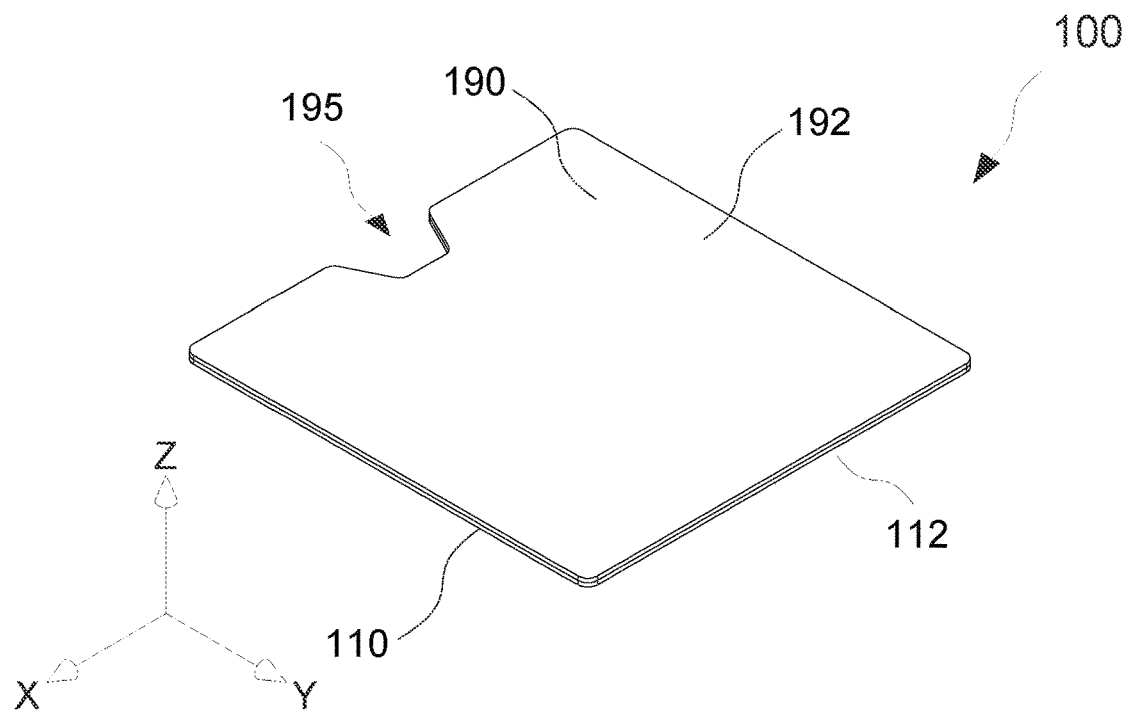
FIG. 1A is a perspective top view illustrating a vapor chamber, according to embodiments of the disclosure.

It should be understood that the drawings are not to scale and that the disclosed embodiments are sometimes illustrated diagrammatically and in partial views. In certain instances, details that are not necessary for an understanding of the disclosed method and apparatus, or that would render other details difficult to perceive can have been omitted. It should be understood that the present application is not limited to the particular embodiments illustrated herein.

DETAILED DESCRIPTION

The present application is now described more fully hereinafter with reference to the accompanying drawings, in which embodiments are shown. Embodiments can, however, be embodied in many different forms and should not be construed as being limited to the various embodiments set forth herein; rather these embodiments are provided so that this disclosure will be thorough and complete and will fully convey the scope of the example embodiments to those of ordinary skill in the relevant art.

Like numbers refer to like elements throughout. In the figures, the thickness of certain lines, layers, components, elements or features can be exaggerated for clarity. Where used, broken lines illustrate optional features or operations unless specified otherwise.

The terminology used herein is for the function of describing particular embodiments only and is not intended to be limiting the example embodiments. As used herein, the singular forms "a," "an" and "the" are intended to include plural forms as well, unless the context clearly indicates otherwise. It will be further understood that the terms "comprises" or "comprising," as used herein, encompass the notions of "including" and "having" and specify the presence of stated features, integers, steps, operations, elements components and/or groups or combinations thereof, but do not preclude the presence or addition of one or more other features, integers, steps, operations, elements, components and/or groups or combinations thereof.

The use of "for example" or "such as" to list illustrative examples does not limit to only the listed examples. Thus, "for example" or "such as" means "for example, but not limited to" or "such as, but not limited to" and encompasses other similar or equivalent examples. As used herein, the term "and/or" includes any and all possible combinations or one or more of the associated listed items, as well as the lack of combinations when interpreted in the alternative ("or"). As used herein, the terms "embodiment" or "present embodiment" are non-limiting terms and not intended to refer to any single aspect of the particular embodiment but encompass all possible aspects as described in the specification and the claims.

Unless otherwise defined, all terms (including technical and scientific terms) used herein have the same meaning as knowingly understood by one of ordinary skill in the art to which example embodiments belong. It will be further understood that terms, such as those defined in knowingly used dictionaries, should be interpreted as having a meaning that is consistent with their meaning in the context of the specification and claims and should not be interpreted in an idealized or overly formal sense unless expressly so defined herein. Well-known functions or constructions cannot be described in detail for brevity and/or clarity.

It will be understood that when an element is referred to as being "on," "assembled" to, "connected" to, "coupled" with, "contacting," etc., another element, it can be directly on, assembled to, connected to, coupled with and/or contacting the other element or intervening elements can also be present. In contrast, when an element is referred to as being, for example, "directly on," "directly assembled" to, "directly connected" to, "directly coupled" with or "directly contacting" another element, there are no intervening elements present. It will also be appreciated by those of ordinary skill in the relevant art that references to a structure or feature that is disposed "adjacent" another feature can have portions that overlap or underlie the adjacent feature.

Spatially relative terms, such as "under," "below," "lower," "over," "upper" and the like, can be used herein for ease of description to describe an element's or feature's relationship to another element's or feature's as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus the exemplary term "under" can encompass both an orientation of over and under. The device can otherwise be oriented (rotated 90 degrees or at other orientations) and the spatially relative descriptors used herein interpreted accordingly. Similarly, the terms "upwardly," "downwardly," "vertical," "horizontal" and the like are used herein for the function of explanation only, unless specifically indicated otherwise.

It will be understood that, although the terms first, second, etc., can be used herein to describe various elements, components, regions, layers and/or sections, these elements, components, regions, layers and/or sections should not be limited by these terms. Rather, these terms are only used to distinguish one element, component, region, layer and/or section, from another element, component, region, layer and/or section. Thus, a first element, component, region, layer or section discussed herein could be termed a second element, component, region, layer or section without departing from the teachings of the present application. The sequence of operations (or steps) is not limited to the order presented in the claims or figures unless specifically indicated otherwise.

Embodiments as disclosed herein are directed to vapor chambers having a working fluid therein, and manufacturing methods of the same. For the purposes of discussion, embodiments are directed to heat dissipation devices including vapor chambers. However, embodiments are equally applicable to other types of heat dissipation devices without departing from the scope of the disclosure.

Figure 1B:
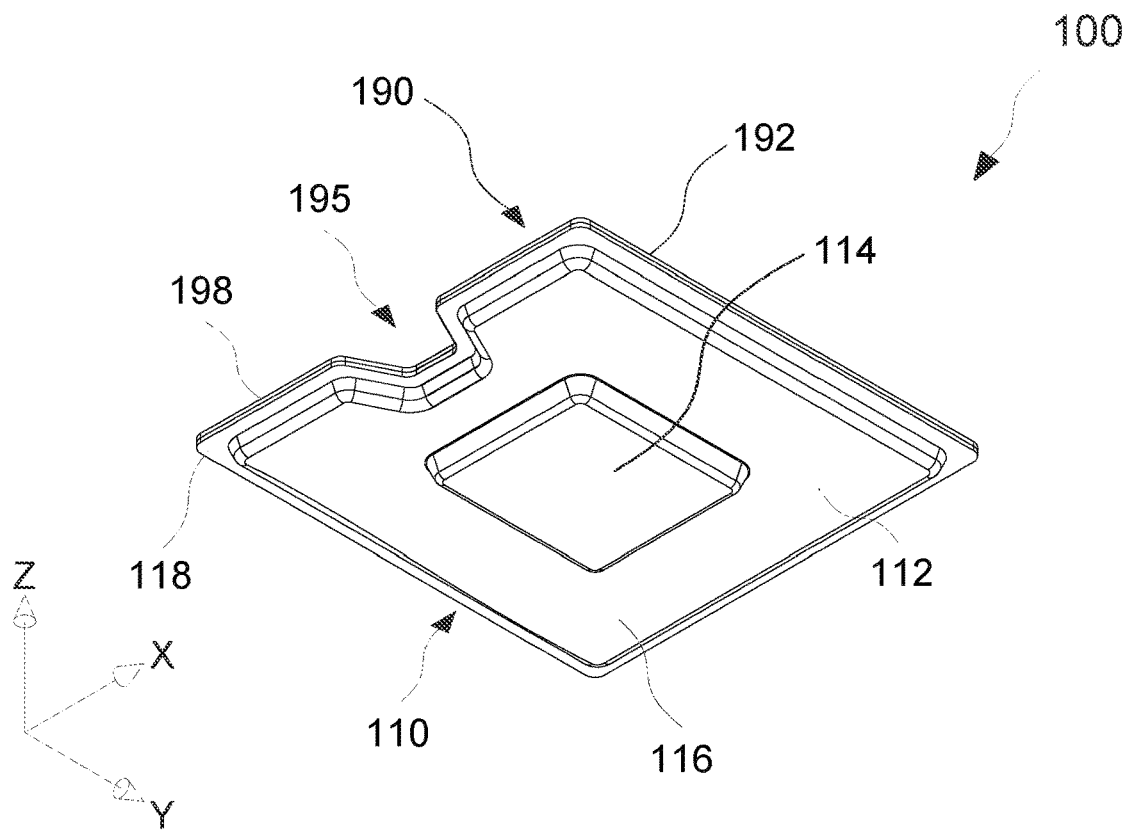
FIG. 1B is a perspective bottom view of the vapor chamber of FIG. 1A, according to embodiments of the disclosure.
Figure 1C:
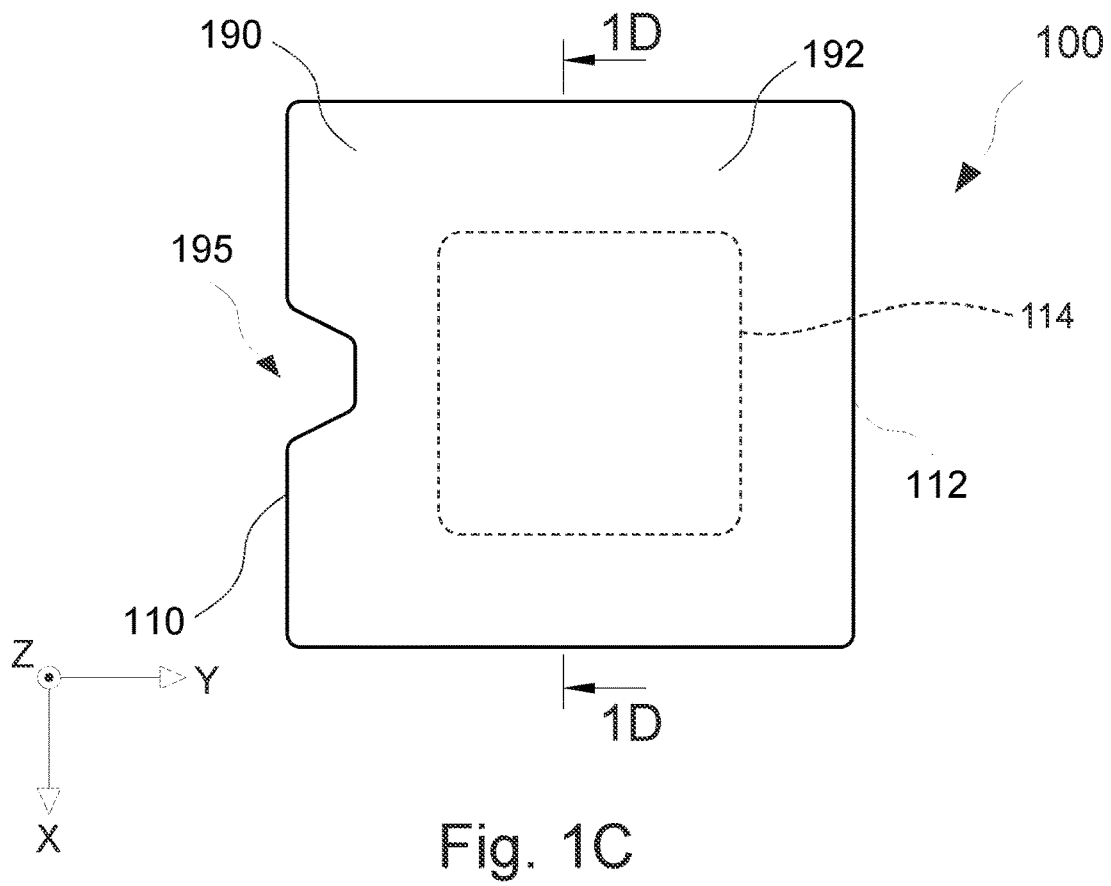
FIG. 1C is a plan view of the vapor chamber of FIG. 1A, according to embodiments of the disclosure.
Figure 1D:
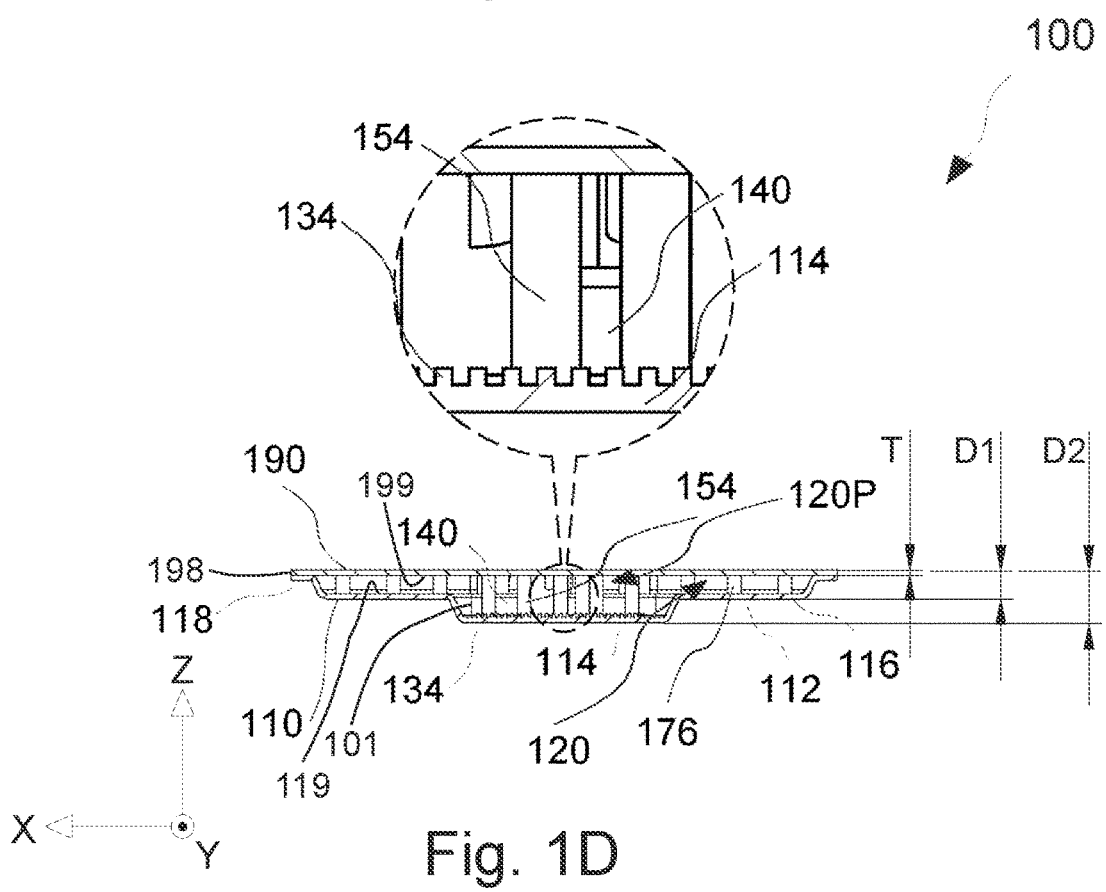
FIG. 1D is a cross-sectional view of the vapor chamber along line 1D-1D in FIG. 1C, according to embodiments of the disclosure.

FIG. 1A is a perspective top view illustrating a vapor chamber 100, according to embodiments of the disclosure. FIG. 1B is a perspective bottom view of the vapor chamber 100 of FIG. 1A, according embodiments of the disclosure. FIG. 1C is a plan view of the vapor chamber 100 of FIG. 1A, according to embodiments of the disclosure. FIG. 1D is a cross-sectional view of the vapor chamber 100 along line 1D-1D in FIG. 1C, according to embodiments of the disclosure. For the sake of explanation, the dimension of the vapor chamber 100 in the X direction is considered as the length, the dimension in the Y direction is considered as the width (breadth), and the dimension in the Z direction is considered as the thickness. Referring to FIGS. 1A to 1D, the vapor chamber 100 includes a first or bottom casing 110 and a second or top casing 190 coupled to each other and defining an internal space 101 of the vapor chamber 100. The vapor chamber 100 includes an evaporator section 114 having a plurality of first support structures 154. In some embodiments, the plurality of first support structures 154 are column (or pillar) like structures. The vapor chamber 100 further includes a condenser section 116 and a condenser vapor flow area 120 between the evaporator section 114 and the condenser section 116 (also see FIG. 2A). The condenser section 116 includes a plurality of second support structures 176. In some embodiments, the plurality of second support structures 176 are column (or pillar) like structures. In some embodiments, and as illustrated, the evaporator section 114 is centrally located in the vapor chamber 100 and the condenser section 116 is located along the periphery of the vapor chamber 100 surrounding the evaporator section 114. However, in other embodiments, the evaporator section 114 is offset from the center. As illustrated, the evaporator section 114 extends or protrudes a certain distance from a first contact surface 112 of the first casing 110. The vapor chamber 100 and the evaporator section 114 are illustrated as having a generally quadrangular shape. However, embodiments are not limited in this regard, and the vapor chamber 100 and the evaporator section 114 can have other desired shapes.

In embodiments, the first casing 110 and the second casing 190 further include a first contact (or outer) surface 112 and a second contact (or outer) surface 192, a first inner surface 119 and a second inner surface 199, and a first bonding edge 118 and a second bonding edge 198, respectively. On a side of the vapor chamber 100, the first casing 110 and the second casing 190 cooperatively define a working section 195. In some embodiments, and as illustrated, the working section 195 is a U-shaped indentation (or notch) in the side of the vapor chamber 100.

In some embodiments, the plurality of first support structures 154 and second support structures 176 contact the first inner surface 119 and the second inner surface 199 of the first casing 110 and the second casing 190, respectively, and thereby support the first casing 110 and the second casing 190 of the vapor chamber 100.

Referring to FIG. 1D, the evaporator section 114 is recessed in the central portion of the first inner surface 119 of the first casing 110. The evaporator section 114 includes a plurality of heat transfer structures 140 disposed on the first inner surface 119. In an embodiment, the plurality of heat transfer structures 140 are rectangular, plate-like structures that are disposed on the first inner surface 119 with the longer edge of the heat transfer structure 140 in contact with the first inner surface 119. The plurality of heat transfer structures 140 are surrounded by the sidewalls of the evaporator section 114. In some embodiments, the plurality of heat transfer structures 140 are disposed perpendicular to the first inner surface 119. However, in other embodiments, the plurality of heat transfer structures 140 are disposed on the first inner surface 119 at an angle greater than zero and less than 90°.

The vapor chamber 100 includes the condenser vapor flow area 120, evaporator vapor flow area 220E (FIGS. 2A and 2B), and an evaporator vapor flow upper surface 120P. The condenser vapor flow area 120 is an area where vapor flows in the condenser section 116.

The evaporator vapor flow upper surface 120P is a surface defined by capillary structures (discussed below) on the surface of the heat transfer structures 140 and capillary structures (e.g., wick structure 134) on the first inner surface 119. Vapor generated in the evaporator section 114 flows along the evaporator vapor flow upper surface 120P. The evaporator vapor flow upper surface 120P increases the surface area of the capillary structures and thereby improves heat transfer efficiency.

The at least one evaporator vapor flow area 220E is an area of the evaporator section 114 wherein vapor flows from the evaporator section 114 to the condenser section 116 and in which the plurality of heat transfer structures 140 are absent. The evaporator vapor flow area 220E is above the evaporator vapor flow upper surface 120P. In some embodiments, the evaporator vapor flow area 220E is an area in the recessed evaporator section 114 at the periphery of the recessed evaporator section 114 and in which the heat transfer structures 140 are absent.

Figure 1E:
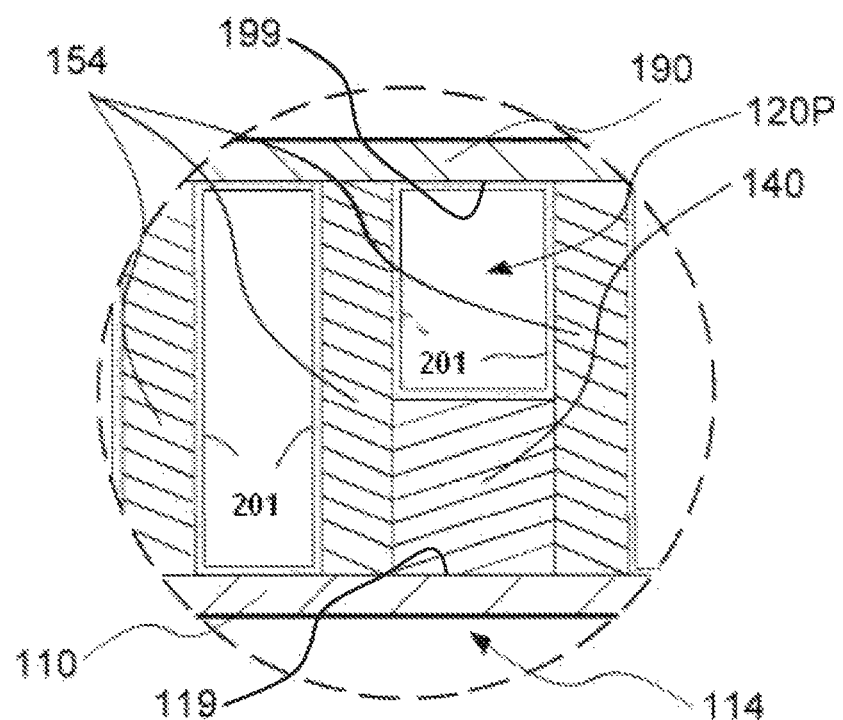
FIG. 1E illustrates portions of the first inner surface and the second inner surfaces, the plurality of heat transfer structures, and the plurality of first support structures including wick structures.

Referring briefly to FIG. 1E, in some embodiments, the first inner surface 119 and the second inner surface 199, one or more of the plurality of heat transfer structures 140, and one or more of the plurality of first support structures 154 include wick structures 201. The wick structures 201 are evenly distributed and substantially of the same thickness. The wick structures 201 increase the heat transfer surfaces of the evaporator section 114 and reduce the high liquid pressure drop due to the capillary forces of the wick structures. In an example, the wick structures 201 are sintered powdered wick structures 201 that include copper. However, embodiments are not limited in this regard. In other embodiments, other types of conductive wick structures or combinations of different types of wick structures can be used. For instance, a screen mesh wick structure or groove wick structure or the like, made of different types of materials or combination of conductive materials other than copper can be used, depending on application and size of the vapor chamber.

Returning to FIGS. 1A-1D, in embodiments, the first inner surface 119 in the evaporator section 114 includes a wick structure 134, and is disposed between the plurality of first support structures 154 and plurality of heat transfer structures 140. In some embodiments, the first casing 110 and the second casing 190 form an airtight vacuum chamber that contains working fluid and includes the plurality of first and second support structures 154, 176, plurality of heat transfer structures 140, and wick structures 201.

In some embodiments, and as illustrated, the second casing 190 is substantially planar. In embodiments, and as illustrated, the evaporator section 114 is centrally positioned and surrounded by the condenser section 116. The evaporator section 114 protrudes from the first contact surface 112. Correspondingly, the evaporator section 114 is recessed from the first inner surface 119. However, the embodiments are not limited in this regard. In other embodiments, the shape and size of the different components of the vapor chamber 100 can be modified or adapted as per design requirements, for example, to avoid (bypass) elements or devices surrounding the heat source, while maximizing available heat transfer surface areas for improved thermal performance requirements. For instance, the first casing 110 is substantially planar and the evaporator section 114 is located in the second casing 190, the evaporator section can be located offset from a central position, and/or there can be more than one recessed evaporator section (multi-recessed). In other embodiments, the transition of the first inner surface 119 between the evaporator section 114 and the condenser section 116 is not a single step-like transition, as illustrated in FIG. 1D, but rather the first inner surface 119 between the evaporator section 114 and the condenser section 116 includes multiple smaller steps (or "terraces") such that the transition between the evaporator section 114 and the condenser section 116 is a more gradual transition (multi-levelled). The vapor chamber 100 can be shaped and sized (or otherwise configured) in a desired manner as long as a desired vapor pressure drop is obtained in the vapor chamber 100, and the plurality of heat transfer structures 140 and the plurality of first support structures 154 include the sintered powdered wick structures thereon. It should be noted that 'substantially' as used herein, indicates that 50% or more of the first contact surface 112 and the second contact surface 192 are planar.

According to embodiments, the vapor chamber is a quadrangle-shaped structure. However, in other embodiments, the vapor chamber can have a variety of shapes including a non-polygonal shaped structure, a structure including bends or curves or a combination thereof, without departing from the spirit and scope of the disclosure.

In some embodiments, the first casing 110 and the second casing 190 of the vapor chamber 100 can each be made of a single piece of conductive material, such as copper and the recessed evaporator section 114 having the plurality of first support structures 154 and the plurality of heat transfer structures 140 and the condenser section 116 having the plurality of second support structures 176 of the first casing 110 are integrally formed. However, the embodiments are not limited thereto. In other embodiments, other conductive materials can be used depending on the application and size of the vapor chamber 100. In other embodiments, one or more components of the vapor chamber, for example, the recessed evaporator section 114, the plurality of first support structures 154, the plurality of heat transfer structures 140, the condenser section 116, the plurality of second support structures 176 are obtained as individual, discrete components that are connected to each other to form the vapor chamber 100.

In some embodiments, the dimensions of the edges (or ends) of the first casing 110 and the second casing 190 is about 20 millimeters to about 600 millimeters and the dimensions of the evaporator section 114 are about 10 millimeters to about 60 millimeters. However, the embodiments are not limited thereto. In other embodiments, the dimensions of the first casing, the second casing the evaporator section 114, and of other components of the vapor chamber 100 can be increased or decreased as required by application and design of the vapor chamber 100, without departing from the scope of the disclosure.

In some embodiments, the thickness T (Z direction) of the first casing 110 and the second casing 190 is about 0.5 millimeters to about 2 millimeters, the depth D1 to the first inner surface 119 in the condenser section 116 measured from the surface of the first bonding edge 118 and, correspondingly, the height of the plurality of second support structures 176, is about 1 millimeters to about 50 millimeters, and the depth D2 to the first inner surface 119 in the evaporator section 114 is measured from the surface of the first bonding edge 118, and, correspondingly, the height of the plurality of first support structures 154, is between 1.5 millimeters to 55 millimeters. However, embodiments are not limited thereto. In other embodiments, the thickness T, and the depths D1, D2 can be increased or decreased as required by the application and design of the vapor chamber 100, without departing from the scope of the disclosure.

In some embodiments, the plurality of first and second support structures 154, 176 are column-shaped and the diameter of the plurality of second support structures 176 is larger than the diameter of the plurality of first support structures 154. However, embodiments are not limited thereto. In other embodiments, the diameter of the plurality of second support structures can be equal to or smaller than the diameter of the plurality of first support structures 154, and the first and second support structures 154, 176 can have other sizes and shapes (e.g., other than column-shaped) depending on application and design the vapor chamber 100, provided the plurality of first and second support structures 154, 176 contact the first and second inner surfaces 119, 199 of the first and second casings 110, 190, respectively, and adequately support the first and second casings 110, 190.

In some embodiments, the thickness (Z direction) of the first bonding edge 118 and second bonding edge 198 is about 1 millimeters to about 3.5 millimeters. However, embodiments are not limited thereto. In other embodiments, the width of the first and second bonding edges can be increased or decreased depending on the application and design of the vapor chamber, provided the first and second bonding edges 118, 198 can be vacuum sealed and operational performance of the vapor chamber 100 is satisfactory.

Figure 2A:
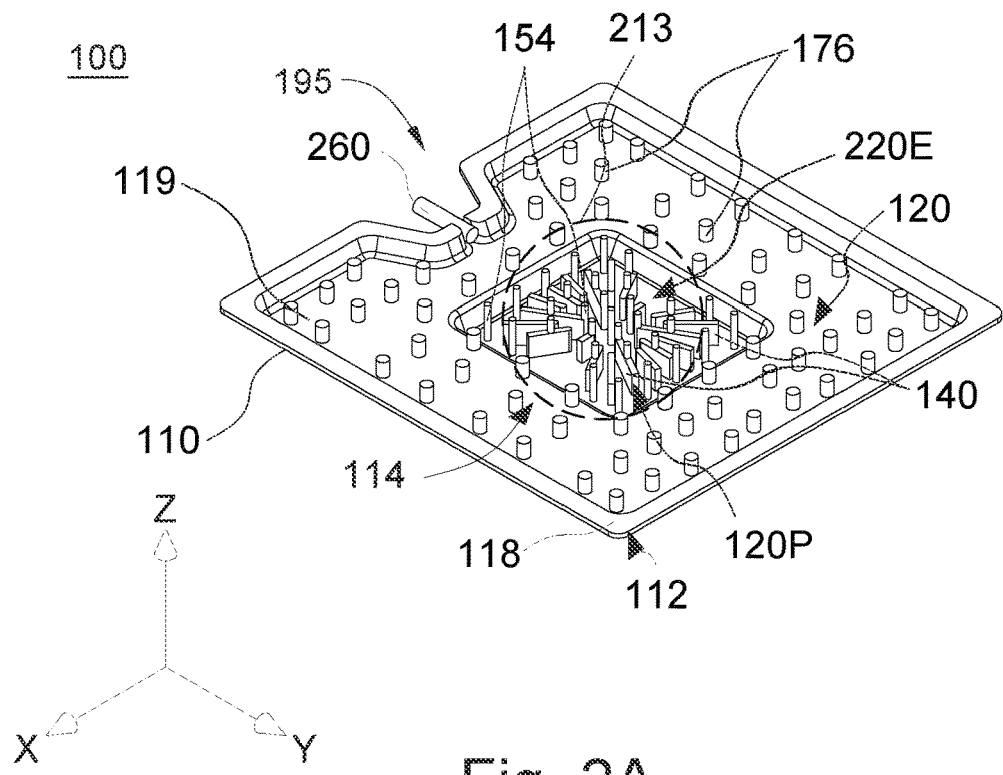
FIG. 2A is a perspective top view illustrating the first casing of the vapor chamber of FIG. 1A including a working pipe, according to embodiments of the disclosure.
Figure 2B:
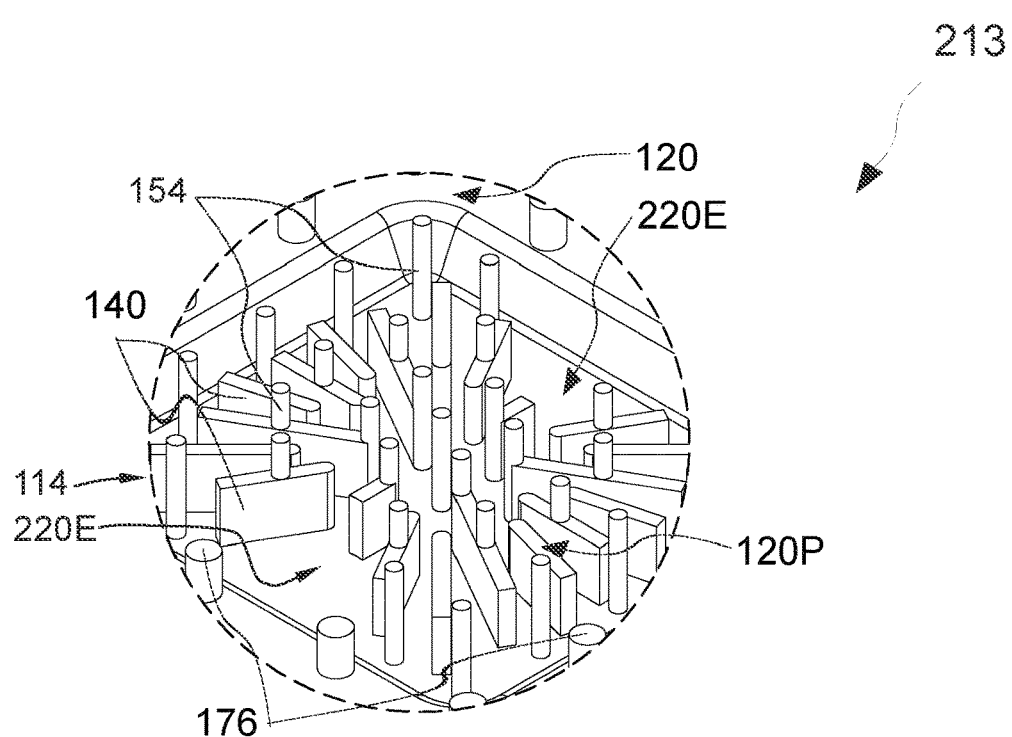
FIG. 2B illustrates a portion of the evaporator section in FIG. 2A in relative detail, according to embodiments of the disclosure.

FIG. 2A is a perspective top view illustrating the first casing 110 of the vapor chamber 100 of FIGS. 1A-1D having a working pipe 260, according to embodiments. FIG. 2B illustrates the evaporator section 114 within the encircled portion 213 in relative detail. As shown in FIGS. 2A and 2B, with continued reference to FIGS. 1A to 1D, the first casing 110 includes the first inner surface 119 including the first bonding edge 118 along a peripheral edge thereof. The first inner surface 119 includes the evaporator section 114 that is recessed in a central location in the first inner surface 119. The plurality of second support structures 176 are disposed on the first inner surface 119 around the evaporator section 114 and in the condenser section 116. The plurality of first support structures 154 are disposed on the first inner surface 119 in the evaporator section 114. The vapor chamber 100 includes the condenser vapor flow area 120, evaporator vapor flow area 220E, and an evaporator vapor flow upper surface 120P.

The plurality of heat transfer structures 140 are substantially rectangular in shape and have different lengths (in the radial direction) with each extending radially (e.g., like spokes of a wheel) from a central portion of the evaporator section 114. The plurality of heat transfer structures 140 are arranged in a staggered formation in the radial direction. In other words, the corresponding radial ends (edges) of the heat transfer structures 140 in the length-wise direction are located at different radial distances from a central portion of the evaporator section 114. In addition, a single heat transfer structure 140 is located in each radial direction. Stated otherwise, no two heat transfer structures 140 are collinear in a radial direction.

In other embodiments, the plurality of heat transfer structures 140 can be non-rectangular shaped, collinear, and have the same lengths. In some other embodiments, the heat transfer structures 140 can be arranged in other than a radially extending configuration and/or in a non-staggered fashion. The heat transfer structures 140 can be arranged in any desired configuration provided a desired vapor pressure drop is obtained in the vapor chamber 100 and without departing from the scope of the disclosure.

The plurality of first support structures 154 are arranged in a desired pattern. The pattern may include the plurality of first support structures 154 arranged at regular intervals. Alternatively, the plurality of first support structures 154 may be arranged at irregular intervals. As illustrated in FIG. 2B, one or more first support structures 154 are arranged on top of heat transfer structures 140. In some embodiments, some first support structures 154 contact the heat transfer structures 140. The plurality of second support structures 176 are arranged in a desired pattern. The pattern may include the plurality of second support structures 176 arranged at regular intervals. Alternatively, the plurality of second support structures 176 may be arranged at irregular intervals.

In embodiments, the plurality of first support structures 154, the plurality of heat transfer structures 140, and the plurality of second support structures 176 are integrally formed, by stamping, CNC milling, or other methods. Alternatively, one or more of the plurality of first support structures 154, the plurality of heat transfer structures 140, and the plurality of second support structures 176 are obtained as discrete components and coupled to the first inner surface 119 using bonding techniques such as welding, diffusion bonding, thermal pressing, soldering, brazing, adhesive joining, a combination thereof, and the like.

In some embodiments, the sintered powdered wick structure 201 of the first inner surface 119 is formed using a mold having the powdered wick structure evenly distributed thereon. The mold is placed covering structures on the first inner surface 119 and then sintered. The size of the mold is adjusted such that the thickness of the sintered powdered wick structure on the inner surface 119 and the first support structure 154 are substantially the same. As an example, the diameter of the portion of the mold covering the first support structure 154 is about the same as the diameter of the first support structure 154 and thickness of the sintered powdered wick structure.

The first casing 110 includes a working pipe 260 secured to the first bonding edge 118 of the first inner surface 119 in the working section 195 thereof. The working pipe 260 is disposed in a gap or opening in the working section 195 of the first bonding edge 118. The working pipe 260 allows for fluid communication with the internal space 101 of the vapor chamber 100. The internal space 101 includes a working fluid that is introduced into the inner chamber via the working pipe 260.

In order to introduce the working fluid, the second casing 190 is vacuum sealed to the first casing 110 using bonding techniques such as welding, diffusion bonding, thermal pressing, soldering, brazing, adhesive joining or the like. The working pipe 260 is bonded using similar techniques. The working fluid is then introduced in the internal space 101 via the working pipe 260. The opening of the working pipe 260 is sealed (e.g., by flattening and bonding the ends) once the working fluid has been introduced and air vacuumed out of the internal space 101. The portion of the working pipe 260 extending from the edges is trimmed.

Figure 3A:
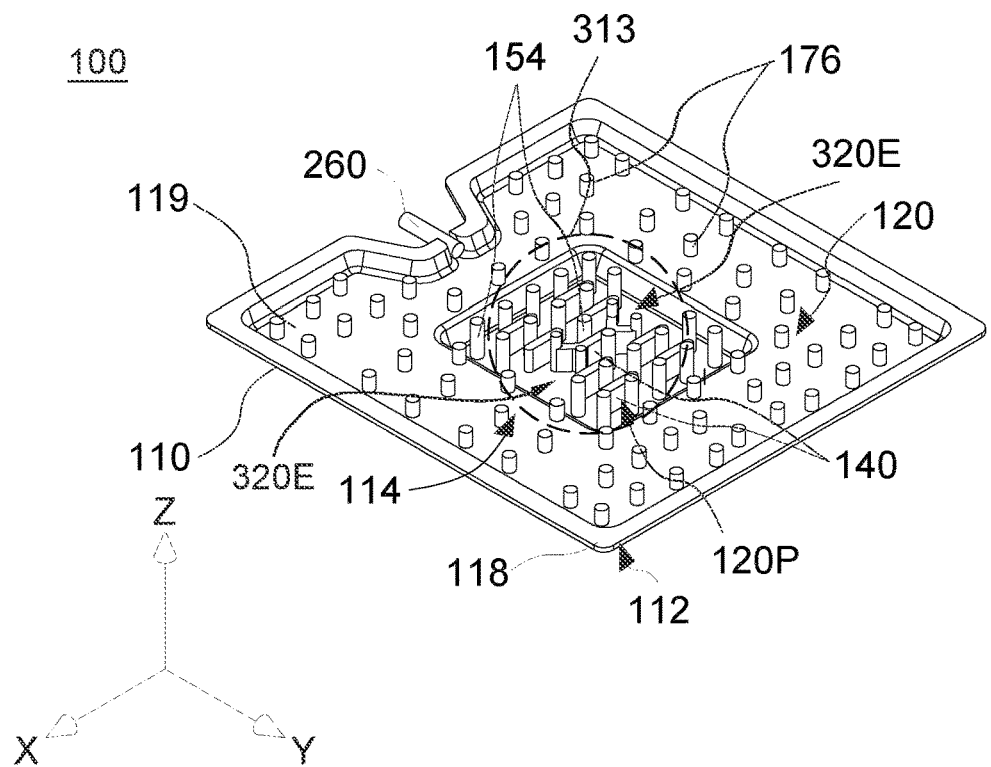
FIG. 3A is a perspective top view of the first casing of the vapor chamber of FIG. 1A, according to embodiments of the disclosure.
Figure 3B:
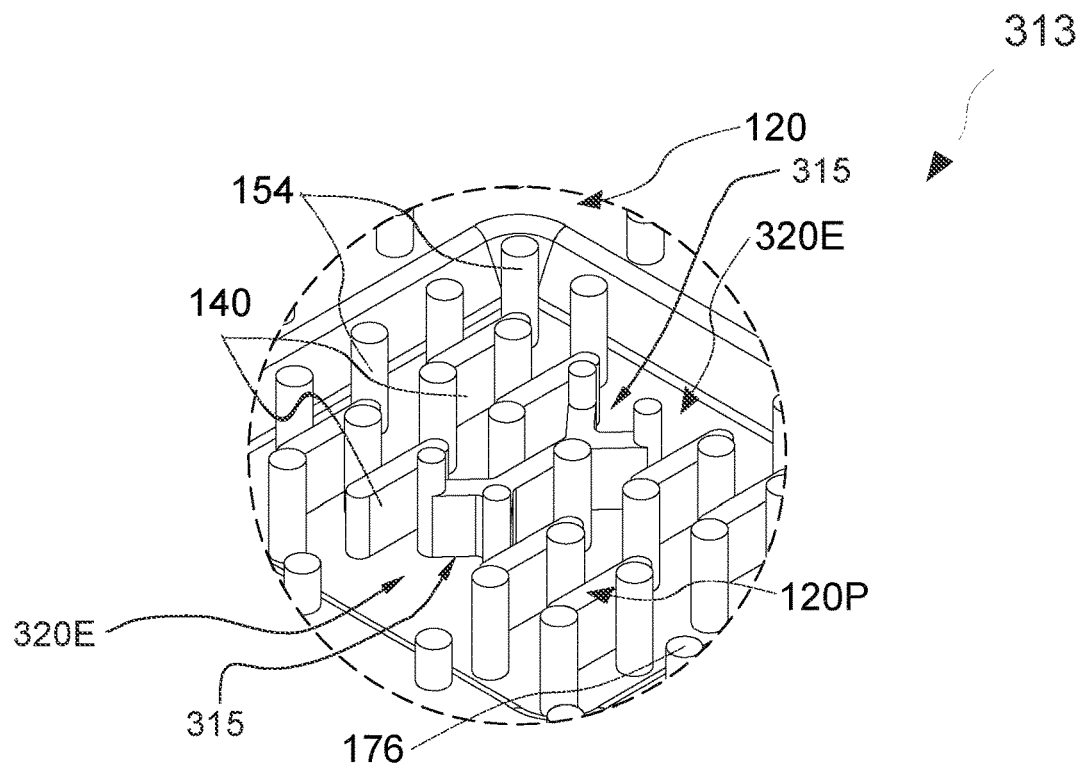
FIG. 3B is a perspective view illustrating a portion of the evaporator section in FIG. 3A in relative detail.

FIG. 3A is a perspective top view of the first casing 110 of the vapor chamber 100, according to other embodiments. FIG. 3B is a perspective view illustrating the evaporator section 114 in the encircled portion 313 in FIG. 3A in relative detail. As shown in FIGS. 3A and 3B, with continued reference to FIGS. 1A to 1D, the plurality of heat transfer structures 140 in the evaporator section 114 of the first casing 110 are substantially rectangular-shaped and arranged parallel to each other in a staggered formation in the width direction (Y direction). The plurality of heat transfer structures 140 have similar lengths, and two or more (two illustrated) heat transfer structures 140 are arranged in a row (i.e., collinear). As illustrated, a single central heat transfer structure 140 is disposed in the central portion of the evaporator section 114. The central heat transfer structure 140 has substantially wishbone shaped longitudinally ends 315. The ends are connected with a connecting portion arranged in the central portion and parallel to the other heat transfer structures 140 in the evaporator section 114. The evaporator vapor flow area 320E is defined adjacent the central heat transfer structure 140 and adjacent the longitudinally ends 315. The wick structure 134 is omitted in FIGS. 3A and 3B for sake of illustration; however, it should be noted that the vapor chamber 100 includes the wick structure 134. In some embodiments, the wick structure 134 includes a grooved wick structure, a sintered powder, or a metal mesh structure.

Figure 4A:
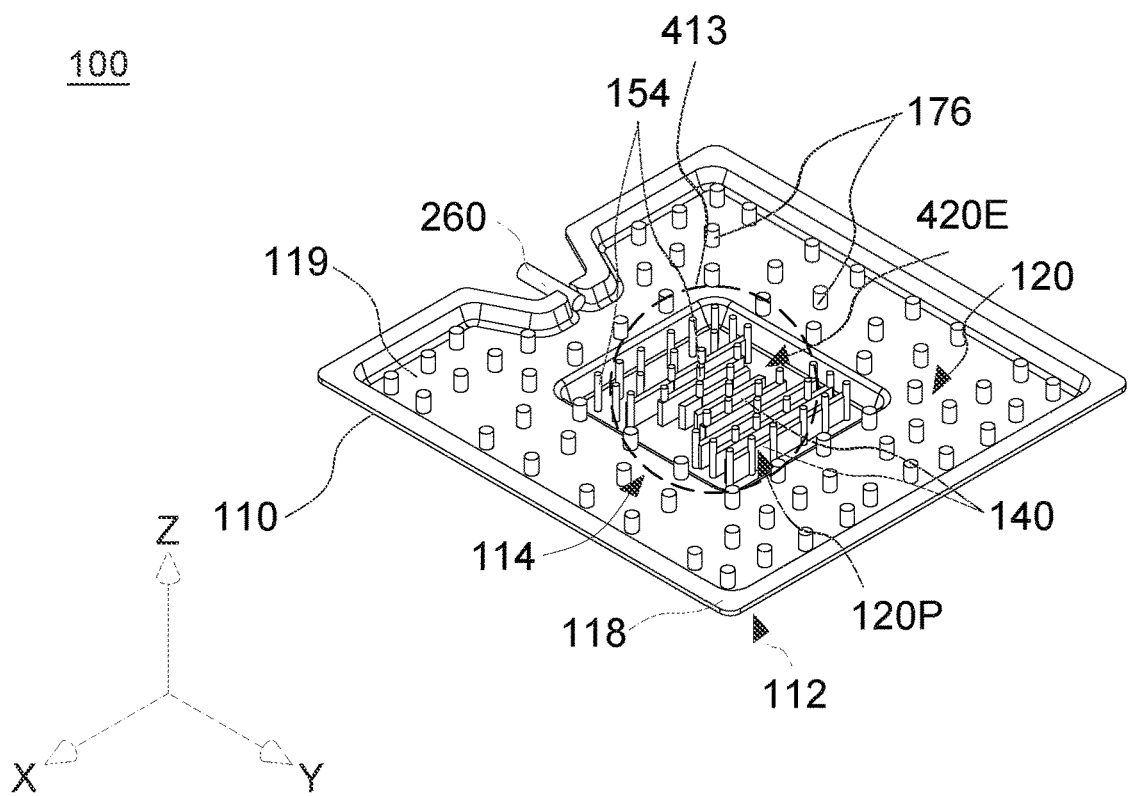
FIG. 4A is a perspective top view illustrating the first casing 110 of the vapor chamber 100, according to embodiments of the disclosure.
Figure 4B:
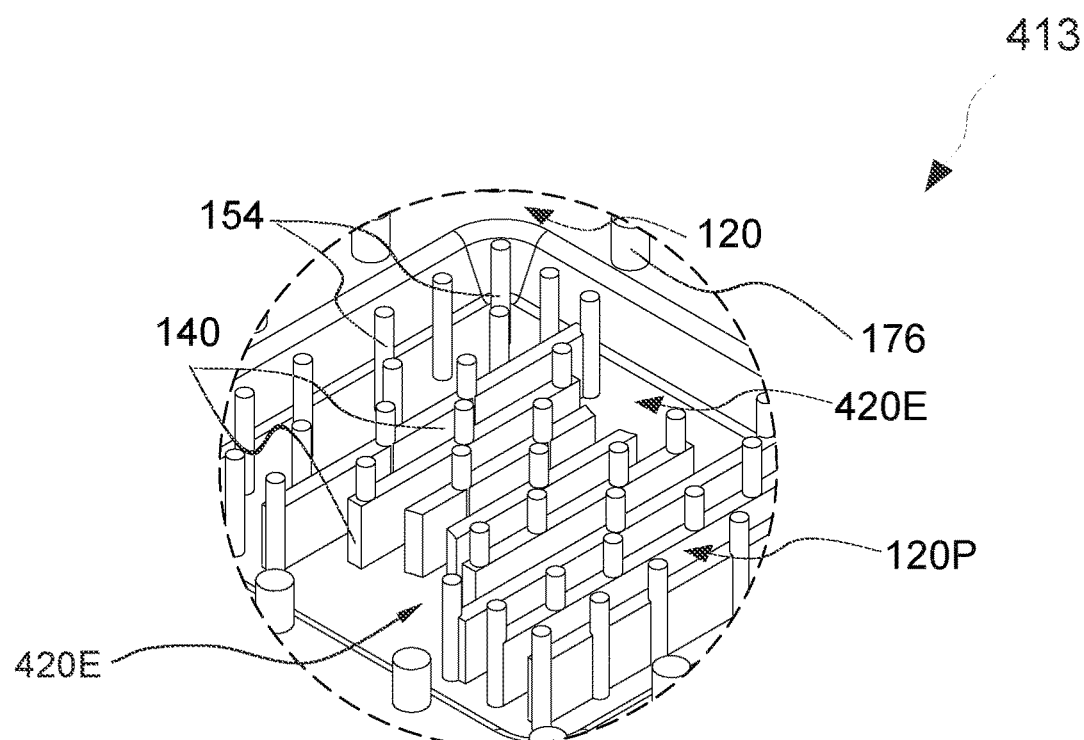
FIG. 4B is a perspective view illustrating the evaporator section in FIG. 4A in relative detail, according to embodiments of the disclosure.

FIG. 4A is a perspective top view illustrating the first casing 110 of the vapor chamber 100, according to another embodiment. FIG. 4B is a perspective view illustrating the evaporator section 114 in the encircled portion 413 in FIG. 4A in relative detail. As shown in FIGS. 4A and 4B, with continued reference to FIGS. 1A to 1D, the plurality of heat transfer structures 140 in the evaporator section 114 of the first casing 110 are substantially rectangular-shaped and arranged in parallel extending away from a central portion of the evaporator section 114. The plurality of heat transfer structures 140 are arranged parallel to each other in the width direction (Y direction) and in the order of increasing lengths (X direction) from the central portion of the vapor chamber 100. Thus, the heat transfer structures 140 closest to the central portion are of the smallest length and the heat transfer structures 140 closest to the edges have the longest length. The plurality of heat transfer structures 140 are arranged in rows each including one heat transfer structure 140 that is parallel to heat transfer structures 140 in adjacent rows. The length of two centrally located heat transfer structures 140 is substantially the same. In some embodiments, two or more heat transfer structures 140 adjacent an edge (e.g., bonding edge 118) of the vapor chamber 100 having the longest length. As illustrated, an evaporator vapor flow area 420E is defined adjacent the heat transfer structures 140 located in the central portion. The wick structure 134 is omitted in FIGS. 4A and 4B for sake of illustration; however, it should be noted that the vapor chamber 100 includes the wick structure 134. In some embodiments, the wick structure 134 includes a grooved wick structure, a sintered powder, or a metal mesh structure.

The vapor chambers 100 in FIGS. 2A to 4B include two evaporator vapor flow areas 220E (FIG. 2A), 320E (FIG. 3A), 420E (FIG. 4A). However, in other embodiments the vapor chamber 100 includes one (1) or more than two (2) evaporator vapor flow areas, and the evaporator vapor flow areas can have any desired location and have a desired shape or size as required by the application and design.

Figure 5A:
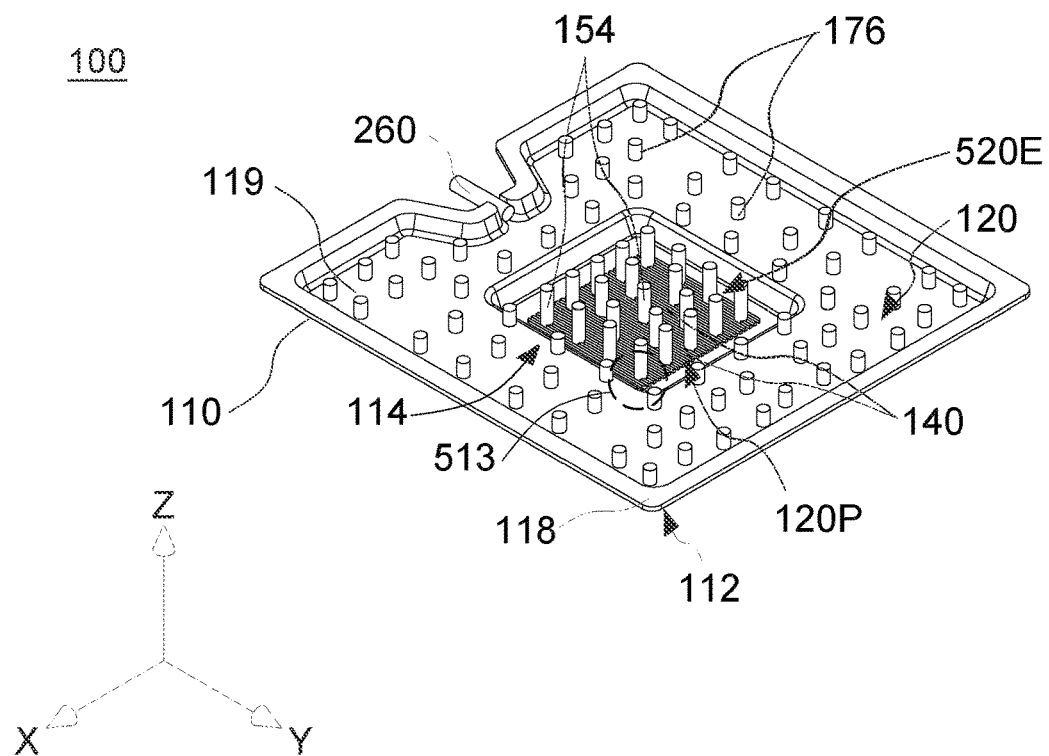
FIG. 5A is a perspective top view of the first casing of the vapor chamber, according to embodiments of the disclosure.
Figure 5B:
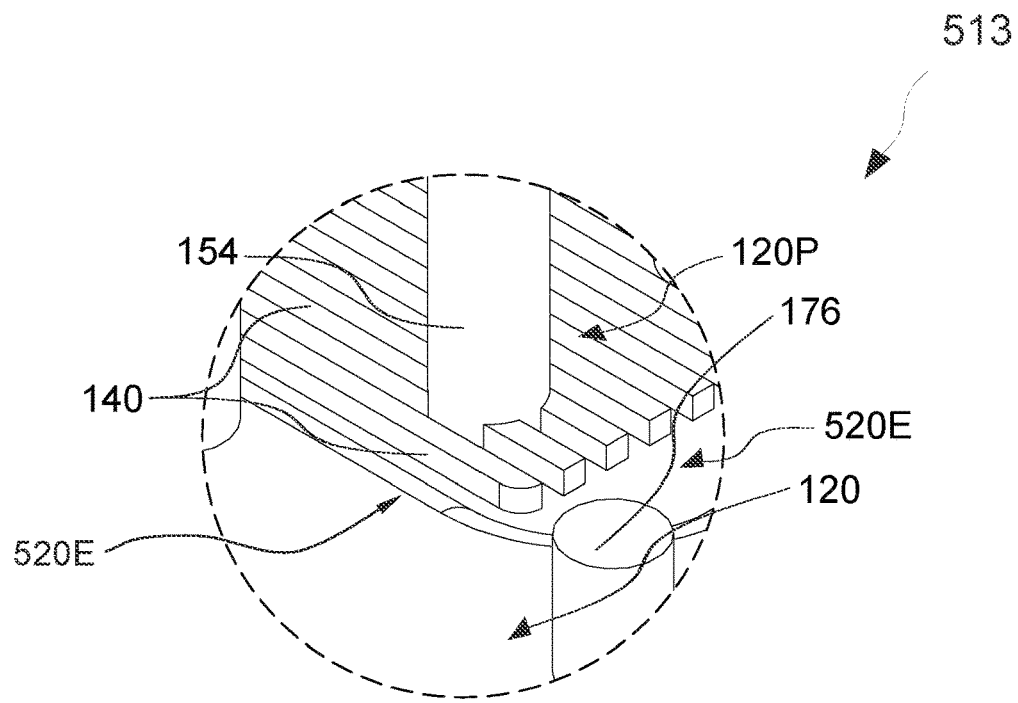
FIG. 5B is a perspective view a portion of the evaporator section in FIG. 5A in relative detail.

FIG. 5A is a perspective top view of the first casing 110 of the vapor chamber 100, according to another embodiment. FIG. 5B is a perspective view illustrating portion 513 of the evaporator section 114 in FIG. 5A. As shown in FIGS. 5A and 5B, with continued reference to FIGS. 1A to 1D, the plurality of heat transfer structures 140 in the evaporator section 114 of the first casing 110 are substantially rectangular-shaped strip-like structures arranged parallel to each other in the width direction (Y direction) in the evaporator section 114. However, in other embodiments, the heat transfer structures 140 are arranged parallel to each other in the length direction (X direction). The plurality of heat transfer structures 140 have similar lengths and each row includes one heat transfer structure 140. One or more first support structures 154 are located in some of the rows of the heat transfer structures 140. Thus, some rows of the heat transfer structures 140 are discontinuous (e.g., interrupted by presence of one or more first support structures 154). The wick structure 134 is omitted in FIGS. 5A and 5B for sake of illustration; however, it should be noted that the vapor chamber 100 includes the wick structure 134. In some embodiments, the wick structure 134 includes a grooved wick structure, a sintered powder, or a metal mesh structure.

An evaporator vapor flow area 520E is located surrounding the plurality of heat transfer structures 140 and a height of the plurality of heat transfer structures 140 is minimized to increase the evaporator vapor flow upper surface 120P thereof.

Figure 6A:
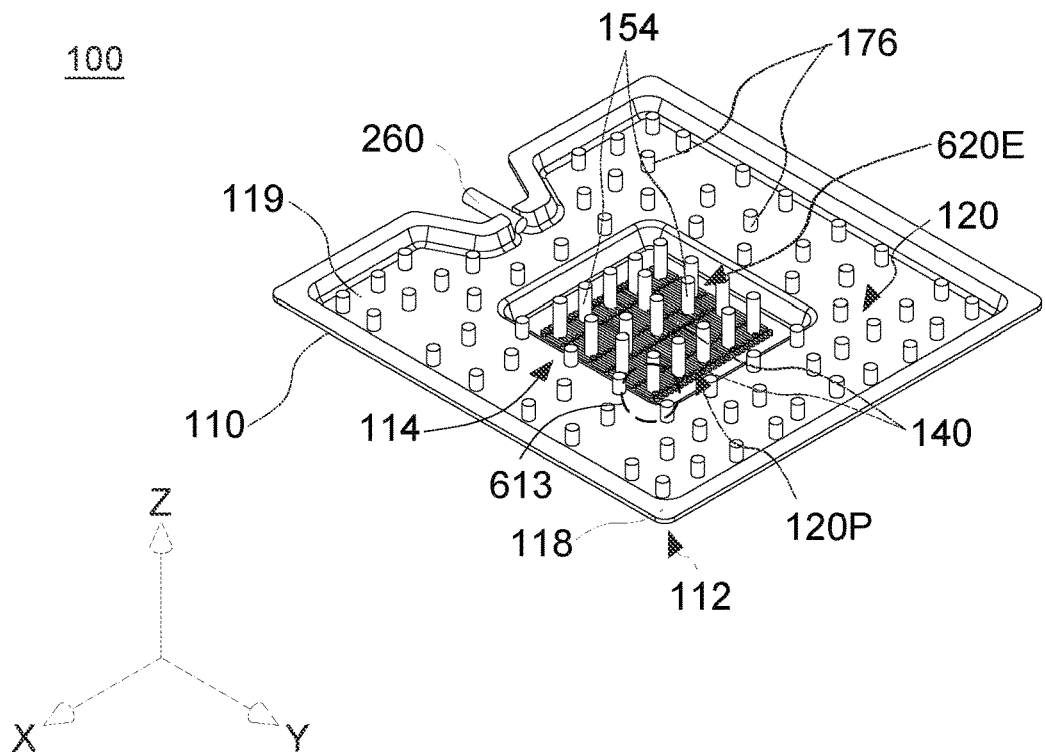
FIG. 6A is a perspective top view of the first casing of the vapor chamber, according to embodiments of the disclosure.
Figure 6B:
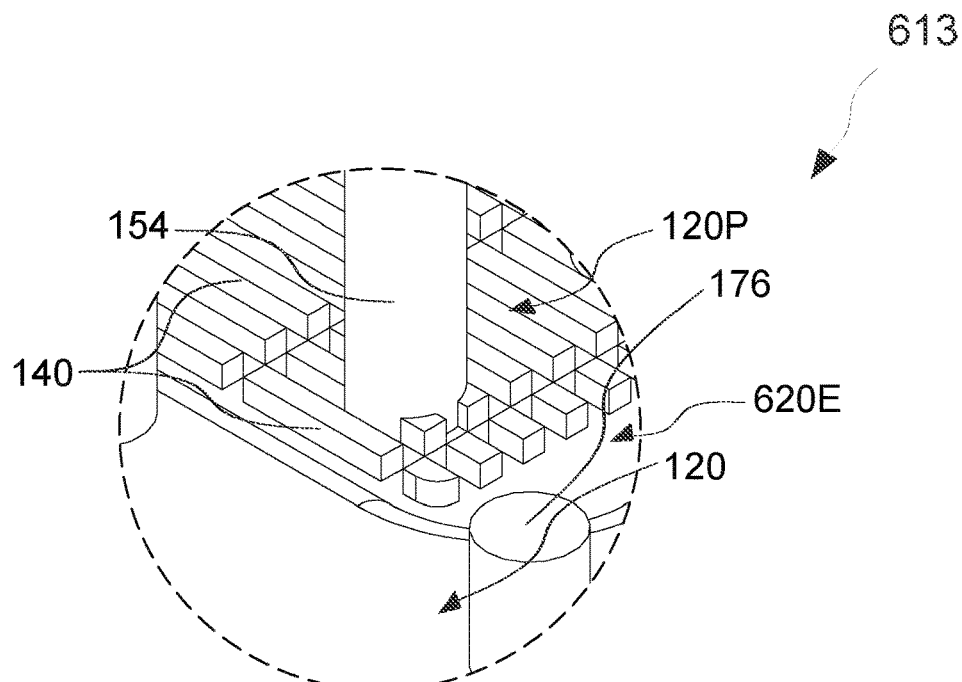
FIG. 6B is a perspective view illustrating a portion of the evaporator section in FIG. 6A in relative detail.

FIG. 6A is a perspective top view of the first casing 110 of the vapor chamber 100, according to embodiments. FIG. 6B is a perspective view illustrating portion 613 of the evaporator section 114 in FIG. 6A. As shown in FIGS. 6A and 6B, with continued reference to FIGS. 1A to 1D, the plurality of heat transfer structures 140 in the evaporator section 114 of the first casing 110 are substantially rectangular-shaped and arranged parallel to each other and in multiple rows in the evaporator section 114 and along the length dimension of the vapor chamber 100. In an embodiment, and as illustrated, the evaporator section 114 includes seven rows of heat transfer structures 140, each row including multiple heat transfer structures 140 having the same length and arranged parallel to each other. Each row of the heat transfer structure 140 includes multiple first support structures 154. An evaporator vapor flow area 620E is defined surrounding the plurality of heat transfer structures 140 and a height of the plurality of heat transfer structures 140 is minimized to increase the evaporator vapor flow upper surface 120P thereof. The wick structure 134 is omitted in FIGS. 6A and 6B for sake of illustration; however, it should be noted that the vapor chamber 100 includes the wick structure 134. In some embodiments, the wick structure 134 includes a grooved wick structure, a sintered powder, or a metal mesh structure.

Figure 7A:
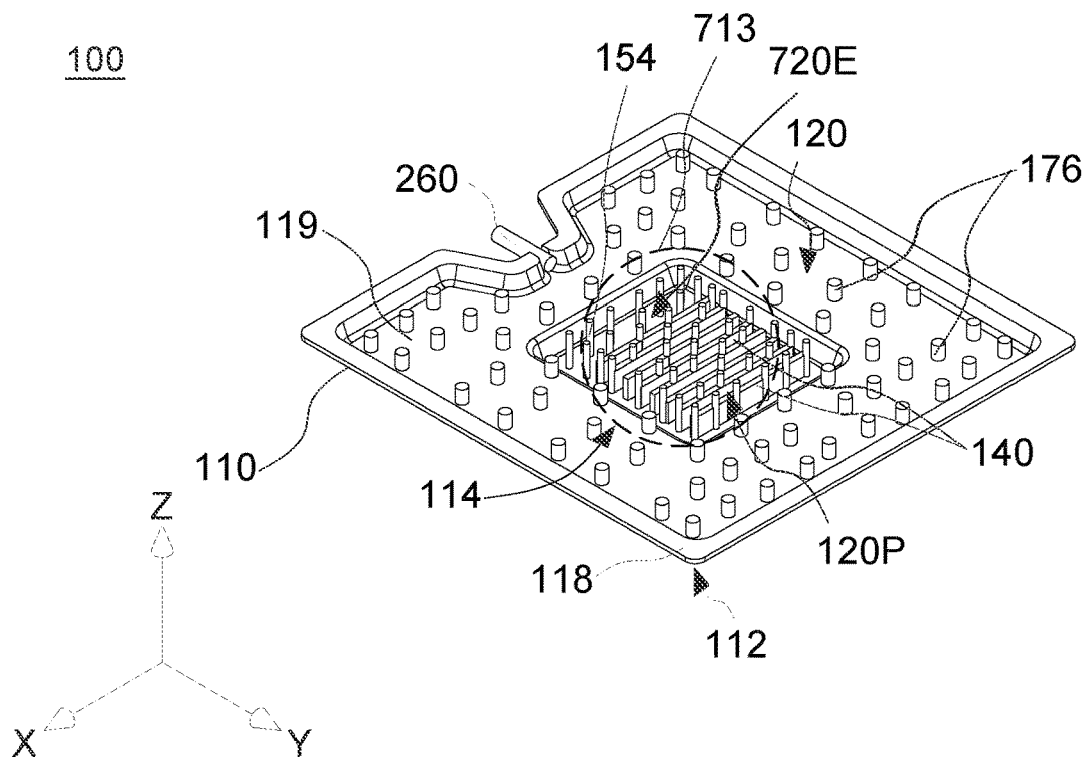
FIG. 7A is a perspective top view of the first casing of the vapor chamber, according to embodiments of the disclosure.
Figure 7B:
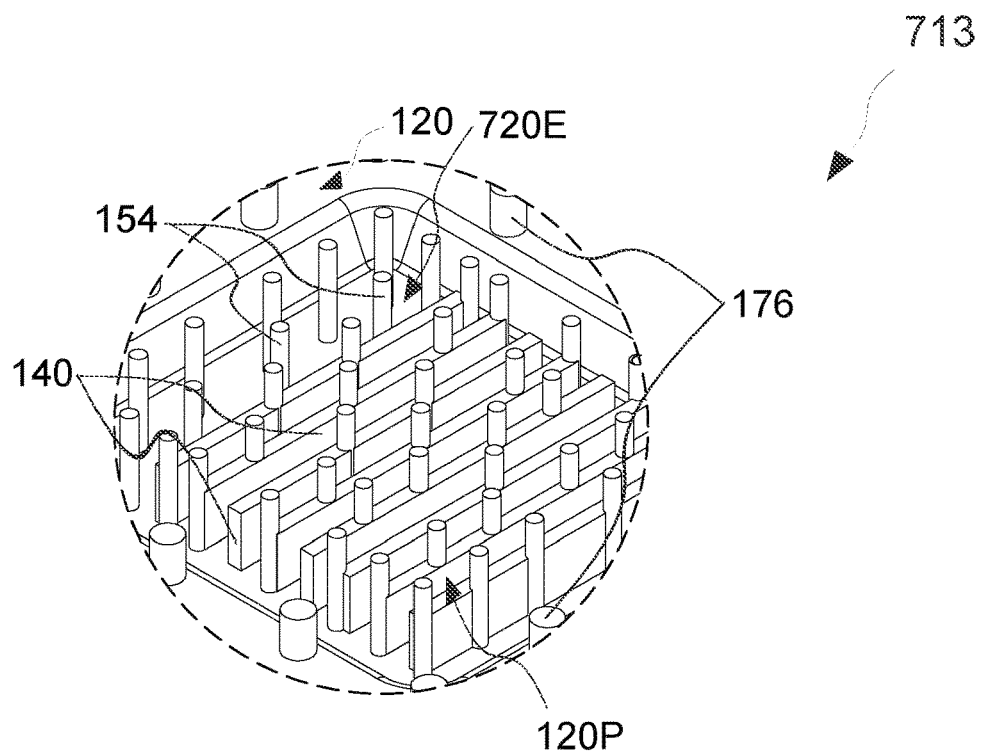
FIG. 7B is a perspective view illustrating a portion of the evaporator section in FIG. 7A in relative detail.

FIG. 7A is a perspective top view of the first casing 110 of the vapor chamber 100, according to embodiments. FIG. 7B is a perspective view illustrating portion 713 of the evaporator section 114 in FIG. 7A. As shown in FIGS. 7A and 7B, with continued reference to FIGS. 1A to 1D, the plurality of heat transfer structures 140 in the evaporator section 114 of the first casing 110 are substantially rectangular-shaped and arranged parallel to each other along the length dimension of the vapor chamber 100 in the evaporator section 114. The wick structure 134 is omitted in FIGS. 7A and 7B for sake of illustration; however, it should be noted that the vapor chamber 100 includes the wick structure 134. In some embodiments, the wick structure 134 includes a grooved wick structure, a sintered powder, or a metal mesh structure. Each heat transfer structure 140 has a same length and are disposed in rows, each row including a single heat transfer structure 140. Multiple first support structures 154 are disposed in each row of the heat transfer structure 140. An evaporator vapor flow area 720E is formed on one side of the plurality of heat transfer structures 140 in the evaporator section 114.

Figure 8:
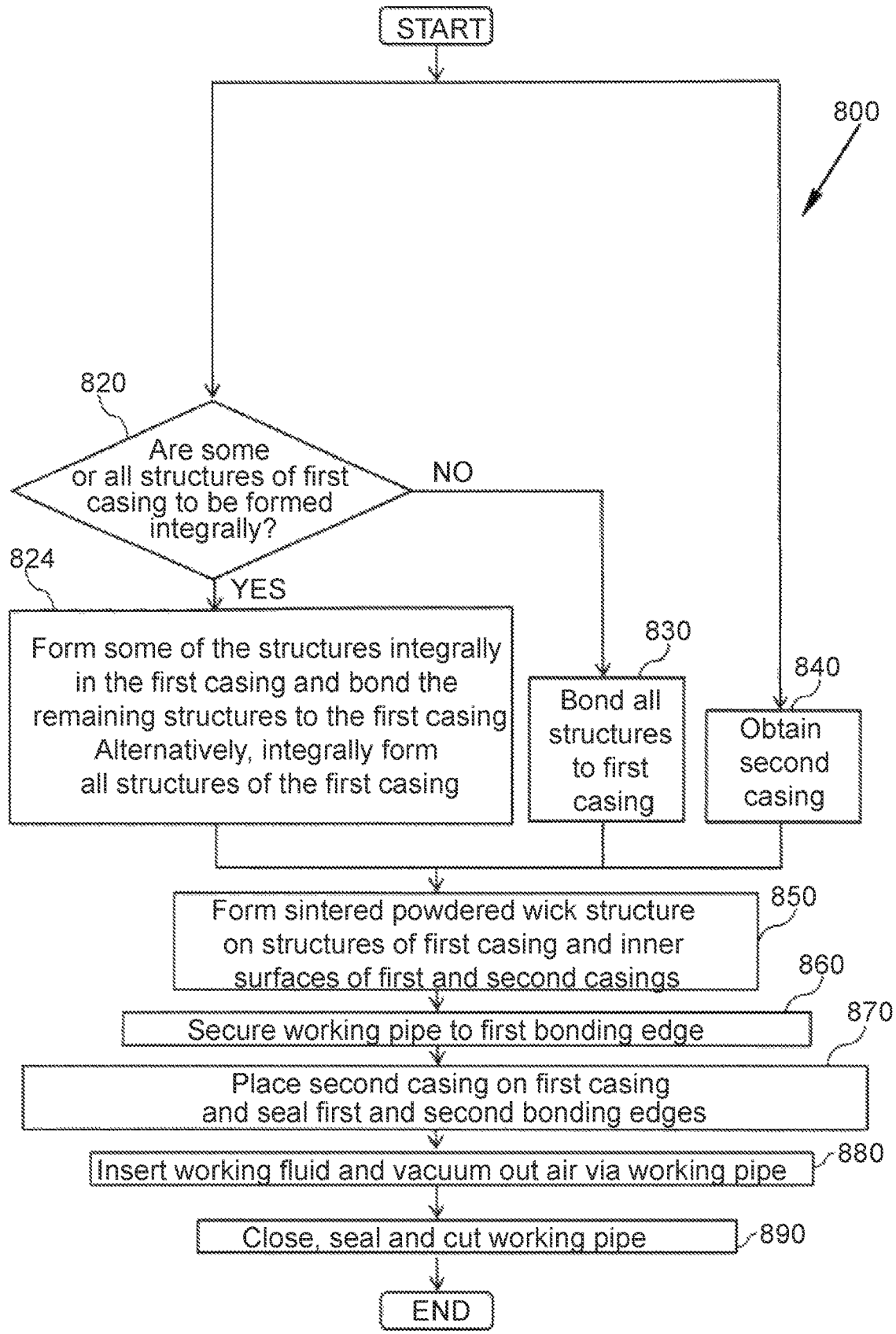
FIG. 8 illustrates a flowchart of a method for manufacturing a vapor chamber, according to embodiments of the disclosure.

FIG. 8 illustrates a flowchart of a method 800 for manufacturing a vapor chamber, according to embodiments of the disclosure. Methods consistent with the present disclosure may include at least some, but not all, of the steps illustrated in method 800, performed in a different sequence. Furthermore, methods consistent with the present disclosure may include at least two or more steps as in method 800 performed overlapping in time, or almost simultaneously.

In operation 810, it is determined whether all structures including the plurality of first support structures 154, the plurality of heat transfer structures 140, and the plurality of second support structures 176 of the first casing 110 are to be integrally formed. If YES, then the method 800 proceeds to operation 820. If NO, then the method 800 proceeds to operation 830.

In operation 820, if some of the structures of the plurality of first support structures 154, the plurality of heat transfer structures 140, and the plurality of second support structures 176 are to formed integrally, then these structures are formed integrally in the first casing and the remaining structures are bonded to the first casing 110. In operation 830, all structures are bonded to the first casing 110. Bonding techniques such as welding, diffusion bonding, thermal pressing, soldering, brazing, adhesive joining, a combination thereof, and the like are used for bonding the structures to the first casing 110.

In operation 840, the second casing 290 is obtained. In operation 850, the sintered powdered wick structure 201 is evenly formed, having substantially the same thicknesses, on the first inner surface 119 and the second inner surface 199 of the first casing 110 and the second casing 190, respectively, the plurality of heat transfer structures 140, and the plurality of first support structures 154. The sintered powdered wick structure 201 is then inspected to ensure sintering and that the thermal performance of the wick structures is as desired.

After cooling, in operation 860, the working pipe 260 is inserted and secured to the first bonding edge 118 of the first casing 110 at the working section 195 thereof. Next, in operation 870, the second casing 190 is placed on the first casing 110 and the first and second bonding edges 118, 198 of the first and second casings 110, 190 having the working pipe 260 inserted and secured therein are bonded and sealed. Next, in operation 880, a working fluid is introduced into the working pipe 260 and air is vacuumed out. In operation 890, the working pipe 260 is closed, sealed, and a portion of the working pipe 260 protruding from the vapor chamber 100 cut. In an embodiment, the working pipe 260 is flattened and then bonded in order to close and seal the working pipe 260. After cooling, working pipe 260 remaining after cutting is trimmed.

In some embodiments, the first and second casings 110, 190, the plurality of first and second support structures 154, 176, and the plurality of heat transfer structures 140 are made of copper. However, embodiments are not limited in this regard. In other embodiments, the first and second casings 110, 190, the plurality of first and second support structures 154, 176, and the plurality of heat transfer structures 140 are made of other heat conducting materials having a relatively high thermal conductivity, as required by the application and size of the vapor chamber 100.

In some embodiments, the working fluid includes deionized water. However, in other embodiments, working fluids includes methanol or acetone. Any desired working fluid can be used as long as the working fluid is vaporized by the heat generated by a heat source and the vapor can condense back to the working fluid and be drawn to the fiber wick structure to flow back to the heat source.

Those of skills in the art will understand that, in other embodiments, further heat treatment processes can be employed during the manufacturing method of the vapor chamber.

In the embodiments, the vapor chamber can coupled to a processing circuit (e.g., a processor) or any other circuit from which heat is to be dissipated using fastening methods such as soldering, brazing or using thermal paste combined with glue. Alternatively, other fastening techniques can be provided for ensuring direct thermal contact between a surface of the processing circuit and the vapor chamber.

Vapor chambers, according to embodiments discussed herein, generate a capillary force in the wick structure equal to or greater than the liquid pressure drop in the wick structures and vapor pressure drop in the vapor chamber. The vapor chambers include the condenser vapor flow area, the evaporator vapor flow area, and the evaporator vapor flow upper surface provide improved vapor pressure drop. The plurality of heat transfer structures and the plurality of first support structures having the sintered powdered wick structures thereon increase the heat transfer surfaces of the evaporator section, and mitigate the high liquid pressure drop of the sintered powered wick structures having high capillary forces. Fluid resistance to sustain capillary force driven flow throughout the wick structures is decreased, increasing porosity and permeability of the evaporator section and providing improved thermal performance. The plurality of first and second support structures support the first and second casings of the vapor chamber and prevent deformation or collapse of the first and second casings.

The present application has been described herein in an illustrative manner, and it is to be understood that the terminology which has been used is intended to be in the nature of words of description rather than of limitation. Many modifications and variations of the present embodiments are possible in light of the above teachings. The present application can be practiced otherwise than as specifically described within the scope of the appended claims. The subject matter of all combinations of independent and dependent claims, both single and multiple dependent, is herein expressly contemplated.

What is claimed is:

1. A heat dissipating device, comprising:
a first casing coupled to a second casing, the first casing including a recessed portion, wherein
the recessed portion at least partially defines an evaporator section of the heat dissipating device,
a condenser section of the heat dissipating device is disposed surrounding the recessed portion,
the first casing and the second casing enclose an internal space of the heat dissipating device,
a plurality of first support structures are arranged in the recessed portion,
a plurality of second support structures are arranged in the condenser section, and
a plurality of heat transfer structures are arranged in the recessed portion,
wherein the plurality of heat transfer structures are elongated structures extending radially from a central region of the recessed portion.

2. The heat dissipating device of claim 1, further comprising a wick structure disposed in the recessed portion.

3. The heat dissipating device of claim 1, wherein at least one first supporting structure of the plurality of the first supporting structures is disposed on top of a heat transfer structure.

4. The heat dissipating device of claim 1, wherein at least one first supporting structure of the plurality of the first supporting structures is disposed between two heat transfer structures.

5. The heat dissipating device of claim 1, wherein the plurality of heat transfer structures are rectangular-shaped and arranged in a staggered formation in the recessed portion.

6. The heat dissipating device of claim 5, wherein two or more heat transfer structures have different lengths.

7. The heat dissipating device of claim 1, wherein a single heat transfer structure is located in each radial direction.

8. The heat dissipating device of claim 1, wherein one or more first support structures of the plurality of first support structures contact one or more heat transfer structures.

9. The heat dissipating device of claim 1, wherein one or more first support structures of the plurality of first support structures are separated from the heat transfer structures.

10. The heat dissipating device of claim 1, wherein the first casing includes a bonding edge along all sides of the first casing and enclosing the internal space, and
at least one side includes an opening in the bonding edge.

11. The heat dissipating device of claim 1, wherein
the first casing and the second casing each include an inner surface that faces the internal space, and wherein
a wick structure is disposed on each of the inner surfaces, one or more of the plurality of heat transfer structures, and on one or more of the plurality of first support structures.

12. A method of manufacturing a heat dissipating device, comprising:
obtaining a first casing including a recessed portion, wherein
the recessed portion at least partially defines an evaporator section of the heat dissipating device,
a condenser section of the heat dissipating device is disposed surrounding the recessed portion,
a plurality of first support structures are arranged in the recessed portion,
a plurality of second support structures are arranged in the condenser section, and
a plurality of heat transfer structures are arranged in the recessed portion, wherein the plurality of heat transfer structures are elongated structures extending radially from a central region of the recessed portion;
obtaining a second casing;
securing a working pipe to the first casing;
positioning the second casing on the first casing;
sealing the first casing and the second casing, and thereby enclosing an internal space of the heat dissipating device;
introducing working fluid in the internal space; and
sealing the working pipe and trimming a portion of the working pipe protruding from the heat dissipating device.

13. The method of claim 12, further comprising:
integrally forming one or more of the plurality of first support structures, the plurality of heat transfer structures, and the plurality of second support structures in the first casing.

14. The method of claim 12, further comprising:
bonding one or more of the plurality of first support structures, the plurality of heat transfer structures, and the plurality of second support structures to the first casing.

15. The method of claim 12, wherein the first casing and the second casing each include an inner surface that faces the internal space, and the method further comprises:
forming a sintered powder structure on the inner surfaces, one or more of the plurality of heat transfer structures, and one or more of the plurality of first support structures.

16. The method of claim 12, further comprising vacuuming out air from the heat dissipating device prior to sealing the working pipe.

17. The method of claim 12, wherein securing the working pipe to the first casing includes securing the working pipe in an opening in one side in a bonding edge disposed along all sides of the first casing and enclosing the internal space.

18. The method of claim 12, wherein at least one first supporting structure of the plurality of the first supporting structures is disposed between two heat transfer structures.

19. The method of claim 12, wherein the plurality of heat transfer structures are rectangular-shaped and arranged in a staggered formation in the recessed portion.

20. The method of claim 12, wherein a single heat transfer structure is located in each radial direction.

* * * * *